(12) United States Patent
Schuster et al.

(10) Patent No.: US 12,203,976 B2
(45) Date of Patent: Jan. 21, 2025

(54) AUTOMATED TEST SYSTEM FOR TESTING SINGULATED ELECTRONIC COMPONENTS AND A METHOD OF TESTING SINGULATED ELECTRONIC COMPONENTS

(71) Applicant: Cohu GmbH, Kolbermoor (DE)

(72) Inventors: Anton Schuster, Grassau (DE); Andreas Wiesböck, Stephanskirchen (DE); Stefan Binder, Brannenburg (DE)

(73) Assignee: Cohu GmbH, Kolbermoor (DE)

( * ) Notice: Subject to any disclaimer, the term of this patent is extended or adjusted under 35 U.S.C. 154(b) by 0 days.

(21) Appl. No.: 17/923,694

(22) PCT Filed: May 14, 2020

(86) PCT No.: PCT/EP2020/063551
§ 371 (c)(1),
(2) Date: Nov. 7, 2022

(87) PCT Pub. No.: WO2021/228403
PCT Pub. Date: Nov. 18, 2021

(65) Prior Publication Data
US 2023/0160949 A1  May 25, 2023

(51) Int. Cl.
*G01R 31/28* (2006.01)
(52) U.S. Cl.
CPC ..... *G01R 31/2834* (2013.01); *G01R 31/2825* (2013.01); *G01R 31/2893* (2013.01)
(58) Field of Classification Search
CPC ............ G01R 31/28; G01R 31/2825; G01R 31/2834; G01R 31/2868; G01R 31/2893

(Continued)

(56) References Cited

U.S. PATENT DOCUMENTS 5,184,068 A  2/1993  Twigg et al.
6,304,093 B1  10/2001  Hilmoe et al.
(Continued)

FOREIGN PATENT DOCUMENTS

| KR | 101897638 B1 | 9/2018 | |
|---|---|---|---|
| WO | WO-2015070135 A2 * | 5/2015 | ......... G01R 31/2867 |
| WO | WO-2017/020932 A1 | 2/2017 | |

OTHER PUBLICATIONS

PCT International Preliminary Report on Patentability dated Sep. 19, 2022 in International Application No. PCT/EP2020/063551.
(Continued)

*Primary Examiner* — Alesa Allgood
*Assistant Examiner* — Courtney G McDonnough
(74) *Attorney, Agent, or Firm* — Knobbe, Martens, Olson & Bear, LLP (57) ABSTRACT

An automated test system for testing singulated electronic components comprises a handler, comprising a plurality of handler pickers and/or spinner pickers, the handler pickers and/or spinner pickers being adapted to each pickup one electronic component, at least one processing station for processing one of the electronic components, a first carrier, a second carrier, and a test unit, for testing singulated electronic components located on a carrier. When the second plurality of electronic components on the second carrier are tested in the test unit while the second plurality of electronic components rest on the second carrier, simultaneously the first carrier is loaded with the first plurality of electronic components by the plurality of handler pickers and/or spinner pickers and/or unloaded from the first plurality of electronic components by the plurality of handler pickers and/or spinner pickers.

14 Claims, 6 Drawing Sheets

(58) Field of Classification Search
USPC .......................................... 324/537, 762.01
See application file for complete search history.

(56) References Cited

U.S. PATENT DOCUMENTS

| | | |
|---|---|---|
| 10,656,206 B1 * | 5/2020 | Patil ................. G01R 31/31905 |
| 2002/0109518 A1 | 8/2002 | Saito et al. |
| 2008/0038098 A1 | 2/2008 | Ito et al. |
| 2008/0042667 A1 * | 2/2008 | Yamashita ....... G01R 31/31905 |
| | | 324/750.16 |
| 2016/0216322 A1 | 7/2016 | Cheung et al. |
| 2018/0017619 A1 | 1/2018 | Mardi |
| 2018/0053671 A1 | 2/2018 | Cheng et al. |

OTHER PUBLICATIONS

PCT International Search Report and Written Opinion dated Jan. 22, 2021 in International Application No. PCT/EP2020/063551.

* cited by examiner

AUTOMATED TEST SYSTEM FOR TESTING SINGULATED ELECTRONIC COMPONENTS AND A METHOD OF TESTING SINGULATED ELECTRONIC COMPONENTS

CROSS-REFERENCE TO RELATED APPLICATION

This application is a U.S. National State Application under 37 U.S.C. § 371 claiming the benefit of priority to International Patent Application No. PCT/EP2020/063551, filed May 14, 2020, which is hereby incorporated by reference in its entirety.

FIELD OF INVENTION

An embodiment of the invention relates to an automated test system for testing singulated electronic components. Further, an embodiment of the invention relates to a method of testing singulated electronic components.

BACKGROUND OF THE INVENTION

Due to a very complicated and sensitive production process of semiconductor components usually certain a not neglectable amount of semiconductor components don't work. As a consequence, the semiconductor components need to be tested most of the time with all their expected features. There is a variety of different machines which carry out the tests. However, there may be a need to provide more flexibility to one machine carrying out the tests.

SUMMARY OF THE INVENTION

There may be a need to offer a handler and for an automated test system for providing a higher flexibility for semiconductor testing.

In order to meet the need defined above, an automated test system for testing singulated electronic components and a method of testing of testing singulated electronic components are provided according to independent claims.

According to an embodiment of the invention an automated test system for testing singulated electronic components comprises:

a handler, comprising a plurality of handler pickers and/or a plurality of spinner pickers, the handler pickers and/or spinner pickers being adapted to each pickup one electronic component at a time, at least one processing station for processing one of the electronic components being picked up by one of the plurality of handler pickers, a carrier station unit, and a first carrier being located in the carrier station unit, wherein the first carrier is adapted to carry a first plurality of electronic components to be tested, and the handler pickers and/or the spinner pickers are adapted to each place one electronic component at a time on the first carrier and the handler pickers and/or spinner pickers are adapted to each pick up one electronic component at a time from the first carrier, a second carrier wherein the second carrier is adapted to carry a second plurality of electronic components to be tested, and a test unit, for testing singulated electronic components located on a carrier, wherein while the second plurality of electronic components on the second carrier are tested in the test unit and while the second plurality of electronic components rest on the second carrier during testing, simultaneously the first carrier is loaded with the first plurality of electronic components by the plurality of handler pickers and/or spinner pickers and/or unloaded from the first plurality of electronic components by the plurality of handler pickers and/or spinner pickers.

According to an embodiment of the invention a method of testing singulated electronic components comprises:

providing a handler, comprising a plurality of handler pickers and/or a plurality of spinner pickers, the handler pickers and/or spinner pickers being adapted to each pickup one electronic component at a time, at least one processing station for processing one of the electronic components being picked up by one of the plurality of handler pickers, and a carrier station unit, and a first carrier being located in the carrier station unit, wherein the first carrier is adapted to carry a first plurality of electronic components to be tested, and the handler pickers and/or spinner pickers are adapted to each place one electronic component at a time on the first carrier and the handler pickers and/or spinner pickers are adapted to each pick up one electronic component at a time, and a second carrier wherein the second carrier is adapted to carry a second plurality of electronic components to be tested, and a test unit, for testing singulated electronic components located on a carrier, wherein the method comprises, testing the second plurality of electronic components of the second carrier in the test unit while the second plurality electronic components rest on the second carrier, and simultaneously loading the first plurality of electronic components on the first carrier with the plurality of handler pickers and/or spinner pickers and/or unloading the first plurality of electronic components from the first carrier with the plurality of handler pickers and/or spinner pickers.

The expression "automated test system" may refer to an assembly used in the backend of semiconductor production which may at least comprise a handler and a testing routine. The automated test system may further comprise a tester for carrying out the test routine.

The expression "testing" may refer to check, examine, or prove. However, testing or actions accompanying the testing may also include moving and marking. In particular, here, semiconductor devices may be the object being tested and are therefore handled (moved) and examined (tested). Testing may, in particular a narrower sense, comprise "functional examination" wherein, i.e., the semiconductor device or electronic component, is examined with its unique or characteristic electronic features, including electronic data based on a characteristic mechanical treatment. Testing by a test unit may comprise a test of at least one of the sensors: (MEMS) microphone, MEMS microspeaker, environmental sensor (such as a gas sensor), fingerprint sensor, gyroscope sensor, accelerometer, humidity sensor, pressure sensor, optical sensor, magnetic sensor.

The term "processing" may refer to at least one of the group of (optical) inspection, flipping, aligning, testing of singulated electronic components, and marking. The term "processing" may refer to a series of operations which in this context include a treatment of singulated electronic components, such as testing in a narrower sense, marking, calibrating, and handling, in particular, positioning and/or aligning. The expression "singulated electronic component" may refer to such a device which may—depending on test result—be assembled on PCB or the like, for use in an electronic device. The term "handler" may refer to a machine moving the singulated electronic component, also called "DUT", i.e. device under test. The expression "processing station" may refer to a location adapted to execute a specific treatment or process for or on a singulated electronic device.

The term "pickers" may refer to a tool, or small machine used for picking one electronic component and placing one electronic component. In particular, the picker may pick up directly from a carrier and may place direct to or on a carrier. The picker may work with a vacuum cup.

The term "simultaneously" applied in this context may refer to at least two (or more) extended or repeated operations having an overlap in time, i.e. the at least two operations are executed at least partially at the same time.

The term "carrier" may, in particular, refer to a test carrier having receptacles for carrying a plurality of electronic components, mostly one electronic component in one receptacle, wherein the (singulated) electronic components rest on the carrier while being tested. The used term "receptacle" is not intended to describe primarily any mechanical boundaries rather than a—most of the time—intended or specific position where one electronic component may be placed. Thus, it may be open if and how the electronic components are held on the carrier.

The expression "carrier station unit" may refer to a location where a carrier is positioned to receive singulated electronic components—e.g. one electronic component in one receptacle. The carrier station unit is accessible for the picker to place singulated electronic components on the carrier lying in the carrier station unit and accessible for picker to remove singulated electronic components from the carrier. That is, placing electronic components may be named "loading" and removing electronic components may also be named "unload".

A gist is that a handler having a plurality of picks for processing singulated electronic components may also have a carrier station unit and that the plurality of picks may stepwise fill the test carrier being positioned in the carrier station unit. This may allow for using the automated test equipment, and/or handler for processing singulated electronic components a such individually, and also to use (test) carriers having singulated electronic components loaded for testing the electronic components in a test unit for testing electronic components arranged on a carrier. By stepwise loading the electronic components one at a time by one picker into a receptacle and on a carrier and stepwise unloading the electronic components from the carrier by the picker, this may allow for using two incompatible methods of processing and testing electronic components and becoming compatible. Even if processing of singulated electronic components in processing stations seems to need a complete different time period than testing a carrier by a test unit in a parallel way the picker driven processing and the carrier driven test may coincide needing the same amount of time or at least a comparable amount of time, so that the whole process and the supply by the automated test equipment may become efficient.

According to an exemplary embodiment the automated test system comprises, when the second plurality of electronic components on the second carrier are tested in the test unit, and simultaneously the first carrier is loaded with or unloaded from the first plurality of electronic components by the plurality of handler pickers and/or spinner pickers:

simultaneously the at least one processing station processes one electronic component picked up by one of the plurality of handler pickers.

In addition to simultaneously loading/unloading the carrier and testing the electronic components on the carrier, further simultaneously may at least one processing station processes one electronic component being picked up by one of the plurality handler pickers. As a consequence, the three sub-processes may run at least partially at the same time.

According to an exemplary embodiment of the automated test system, picking up and placing one electronic component at a time by one handler picker and/or spinner picker comprises:

a movement of the one handler picker and/or spinner picker relative to the carrier.

The term "movement" may refer to a motion or move which may originate from the picker and/or the carrier. This may allow for placing the electronic components into different receptacles on the carrier. The handler pickers and/or spinner pickers themselves may have an additional inner freedom of rotation.

According to an exemplary embodiment of the automated test system, picking up and placing one electronic component at a time by one picker comprises:

a movement of the carrier comprising a linear movement in up to 3 dimensions, and/or a movement of the one picker comprising a linear movement in up to 3 dimensions and/or a rotatable movement of the handler picker and/or spinner picker.

A relative movement of the carrier relative to the picker may originate from a linear movement in up to three dimensions of the carrier and/or a linear movement in up to three dimensions of the carrier and/or a freedom of having an inner rotational freedom to move (or turn).

According to an exemplary embodiment of the automated test system, the carrier station unit comprises a first carrier station and a second carrier station, each of the first and second carrier stations, being adapted to receive, carry, and/or move at least one of the first and second carrier, and being adapted to replace the first carrier by the second carrier.

The carrier station unit may have a first carrier station to receive, hold, and/or move a carrier and may have a second carrier station to receive, hold, and/or move a further carrier. The carrier station unit may be adapted to exchange and/or position the carrier and the further carrier, or the first carrier and the second carrier, respectively.

According to an exemplary embodiment the automated test system further comprises at least one further carrier, adapted to being loaded and unloaded by a handler picker and/or spinner picker with a further plurality of electronic components, wherein the further carrier, is adapted in that the further plurality of electronic components are tested while resting in receptacles of the further carrier.

There may be a first, a second, and a further carrier be located within the automated test equipment. In particular, one of the three carriers may be tested in the test unit, further two carriers may be located in the carrier station unit, or the first and second carrier station, respectively, to be loaded and/or unloaded. The two carriers in the carrier station unit may be loaded and unloaded simultaneously. E.g. two different handler pickers and/or spinner pickers may each first load the first carrier and second, may unload the first carrier, and vice versa.

When two carriers are used, one carrier may be unloaded from tested electronic components and loaded with untested electronic components, while the other carrier may be in the test unit so that the electronic components on the other carrier can be tested. Using two carriers may be appropriate, when unloading and loading electronic components is faster than testing the same number of electronic components.

When three carriers are used, one empty carrier may be waiting in the carrier station to be loaded with the untested electronic components, while another carrier may be tested in the test unit and a further carrier may be unloaded from tested electronic components.

According to an exemplary embodiment the automated test system further comprises at least two processing stations, wherein at least one of the at least two processing stations is located upwards of the carrier station unit, and wherein at least one other of the at least two processing stations is located downwards the carrier station unit.

The terms "upwards" and "downwards" may refer to a direction from lower to higher, and in particular from an earlier time to a later time. I.e. that the handler pickers stop subsequently at the first processing station, the carrier station unit, and then the second processing station to serve each. Equally said, the carrier station unit may be arranged between two different processing stations.

According to an exemplary embodiment of the automated test system, the handler further comprises a spinner, being linear movable and rotatable about a spinner axis, and wherein the plurality of spinner pickers are arranged to pointing radially outwards from the spinner axis.

A spinner may be in particular used if flipping the electronic components require before and after testing.

According to an exemplary embodiment of the automated test system, the handler further comprises a rotary table, wherein the plurality of pickers is arranged at distal ends of pickup heads radially extending from a center of the rotary table.

The expression "rotary table" may refer to a plate being arranged horizontally and turning on axis, perpendicular to the plate. Handlers comprising one central rotary table are also called "turret handler". The expression "arranged at distal ends of pickup heads" may refer to a position of the pickers. Extending radially outward from the axis of the rotary table, there are pickup heads, on which ultimate ends the pickers are arranged, one picker for each pickup head. When the rotary table turns, then the pickup heads with the pickers at their ends may turn around stepwise. The rotary table may turn forewards and/or backwards, depending whether the electronic components to be tested are parts of a so called "lot". The rotary table may allow for loading a specific number of electronic components from a source in one direction and may unload in the counter-direction back to the source.

According to an exemplary embodiment the automated test system further comprises a robot and/or a carrier exchange section, wherein the robot, and/or the carrier exchange section being adapted to receive the first carrier with the first plurality of electronic components and transferring the first carrier to the test unit, in that after having transferred the first carrier the robot and/or the carrier exchange section completely removes from the test unit.

The term "robot" may refer to a device that automatically performs complicated often repetitive tasks, and here, the robot may pick up one of the carriers and may convey or move the one carrier to a different position and in particular to the test unit and, if necessary, inside the test unit. The robot may remove completely from the test unit after positioning the carrier inside the test unit. Same may hold for the "carrier exchange section" wherein the difference to the robot may be that the carrier exchange section may allow only for linear movements of the carrier. The carrier exchange section may completely remove from the test unit after placing carrier inside the test unit. However, the carrier exchange section may be arranged inside the test unit so that here the carrier exchange section may remove from a testing position of the carrier inside the handler.

According to an exemplary embodiment of the automated test system, the test unit is a microphone test unit adapted to test microphones.

The test unit may be or comprise a microphone test unit.

According to an exemplary embodiment the automated test system further comprises at least one of the group of a tester, a soak station, a de-soak station, or a further test unit, wherein at least two of the group of the handler, the test unit, the tester, the soak station, the de-soak station, and the further test unit, have a different footprint.

The term "footprint" may refer to an area on the ground (here: test floor) covered by something. E.g. the test unit, and the further test unit, may have both different footprints and both different footprints than the footprint of the handler on the test floor. The test unit and the further test unit may both be almost independent machines having an own power supply and may be controlled different compared to the handler. The test unit, the further test unit and any other part of the automated test system, such as the tester, the soak station, the de-soak station, if having an own footprint may comprise rollers. The term "rollers" may refer to move on rollers or wheels, i.e. the first test unit, the second test unit, the handler, and all other part having an own footprint may have rollers or wheels as well.

According to an exemplary embodiment the method comprises: when the second plurality of electronic components on the second carrier are tested in the test unit, and simultaneously the first carrier is loaded with and/or unloaded from the first plurality of electronic components with the plurality of pickers, simultaneously processing one electronic component picked up by one of the plurality of pickers with the at least one processing station.

According to an exemplary embodiment the method further comprises: picking up from a carrier, and placing on a carrier, one electronic component at a time with one picker comprising moving the one picker and the carrier, relative to each other.

According to an exemplary embodiment the method comprises: picking up and placing one electronic component at a time with one picker comprising moving the carrier, comprising a linear movement in up to dimensions and/or moving the one picker wherein the movement comprises a linear movement in up to dimensions, and/or a rotatable movement of the picker.

An automated test system for testing singulated electronic components comprises a handler, comprising a plurality of pickers, the pickers being adapted to each pickup one electronic component, at least one processing station for processing one of the electronic components, a first carrier, a second carrier, and a test unit, for testing singulated electronic components located on a carrier. When the second plurality of electronic components on the second carrier are tested in the test unit while the second plurality of electronic components rest on the second carrier, simultaneously the first carrier is loaded with the first plurality of electronic components by the plurality of pickers and/or unloaded from the first plurality of electronic components by the plurality of pickers.

The aspects defined above and further aspects of the pre-sent invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF THE DRAWING

The illustrations in the drawings are schematically. It is noted that in different figures, similar or identical elements are provided with the same reference signs.

Figure 1:
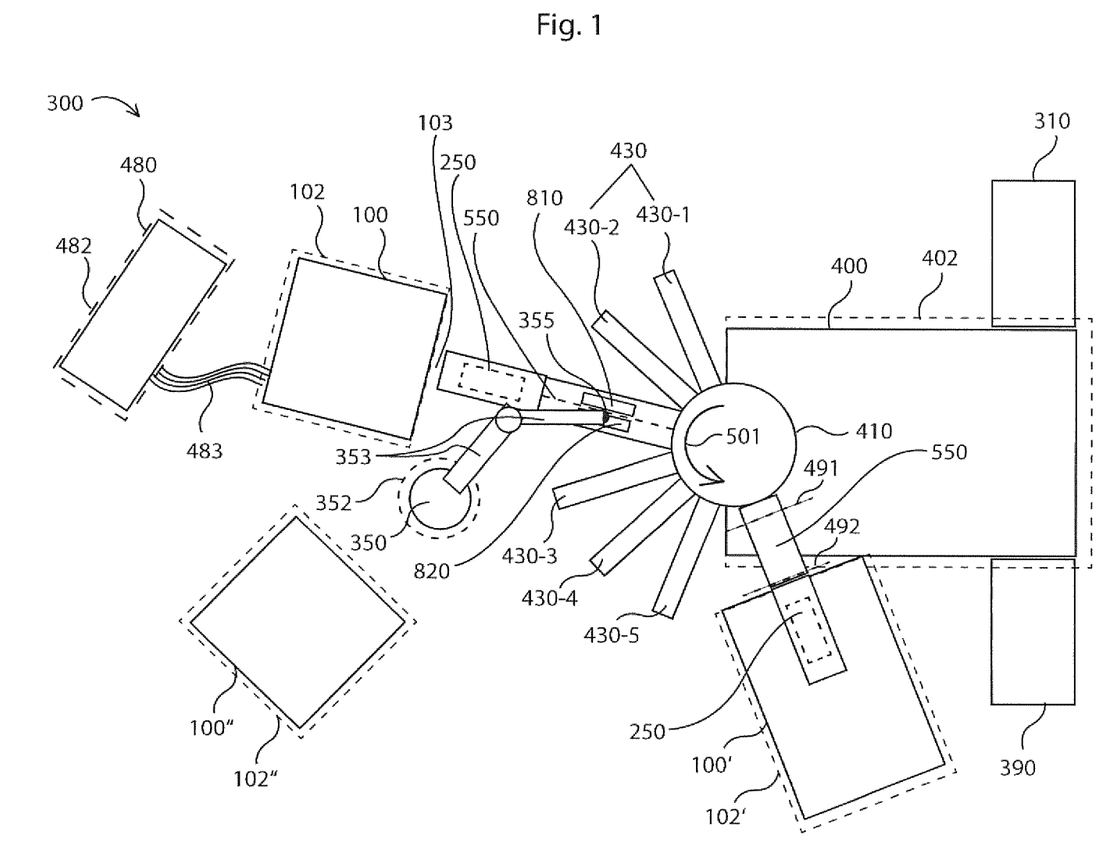
FIG. 1 shows an embodiment of the automated test equipment for testing different types of electronic components

FIG. 1 shows an automated test equipment 300 for testing different types of electronic components.

The automated test equipment 300 comprises a tester 480, and a handler 400 comprising a plurality of processing stations 430-1 to 430-5, or named a processing station 430, in general. The automated test equipment 300 may, in particular, provide a microphone test module 100 and two further test modules 100', 100" for testing MEMS devices or other electronic components.

The handler 400 further comprises a component loader 310 for loading the untested electronic components and a component unloader 390 for unloading the tested electronic components, in particular, MEMS devices, e.g. MEMS microphones. The loader 310 may load singulated electronic components 800*u* from at least one of the sources such as wafer, tray, tube bowl. The unloader 390 may unload the tested electronic components 800*u* to tape & reel, tube, and/or bulk. The handler 400 is designed as a turret handler comprising a rotary table 410 having a specific direction of rotation 501. Around the rotary table 410 different processing stations 430-1 to 430-5 provide a plurality of procedures for electronic component in a backend process. The handler 400 with the rotary table 410 may also be called "turret handler".

Around and adjacent to the rotary table 410 the carrier 400 may comprise a carrier station unit 550. The handler 400 may place singulated electronic components on a first carrier 810 and/or on a second carrier 820. The carriers 810, 820 may be further passed to a sound test module 100 in a more known linearly by a carrier exchange section 250 towards the sound test module 100 or the carriers 810, 820 may be transferred from the carrier station unit 550 to the sound test module 100 by a robot 350. For this reason, the robot 350 may comprise a freely and 3-dimensionally moveable arm 353 comprising a rotatable gripper 355 so that the robot 350 may take up the carrier 810, 820 in different positions and may drop the carrier 810, 820 on different locations and in different orientations of the carrier 810, 820. The robot 350 may position the carrier 810, 820 inside the sound test module 100, or test module 100", or on the carrier exchange section 250 of the sound test module 100.

There may be a gap, or air gap 103 between the microphone test module 100 and the carrier exchange section 250, so that structure-borne sound may be prohibited to travel towards the microphone test module 100. The tester 480 may be connected with the sound test module 100 by a cable 483.

The test module 100' may be coupled towards the handler 400 in a different way such that there is a tight connection between the handler and the test module 100', and the test module 100' may be provided with carriers 810, 820 directly from the carrier station unit 550. Therefore, the carrier exchange section 250 may be partially or completely arranged inside the test module 100'. The test module 100' may, however, be an independent module which may be decoupled from the handler 400 easily and may be e.g. coupled to another handler.

Any of the group of the handler 400, the robot 350, the microphone test module 100, the test two test modules 100', 100", and the tester 480 may each have its own footprint on the test floor, so that the handler footprint 402, the robot footprint 352, the microphone test module footprint 102, the two further test module footprints 102', 102", and the tester footprint 482 differ from each other. This may emphasize that the mentioned components of the automated test equipment 300 may be exchanged easily for every of the mentioned components being a standalone device. Furthermore, a microphone test may be executed with the microphone test module 100 while a structure-borne sound is suppressed with the gap 103 and the test conditions for the microphone test are amended.

The exchangeability of the test module 100' („or 100, 100") may further be indicated with the module boundary 492. Moreover, a carrier station unit boundary 491 depicts a transition from the handler 400 towards the carrier station unit 550 which may also be an exchangeable module depending on the used carrier 810, 820 which may vary, e.g. if a tested MEMS chip is of a so called top-port, or bottom-port type, or may have contact portions on both sides.

Figure 2:
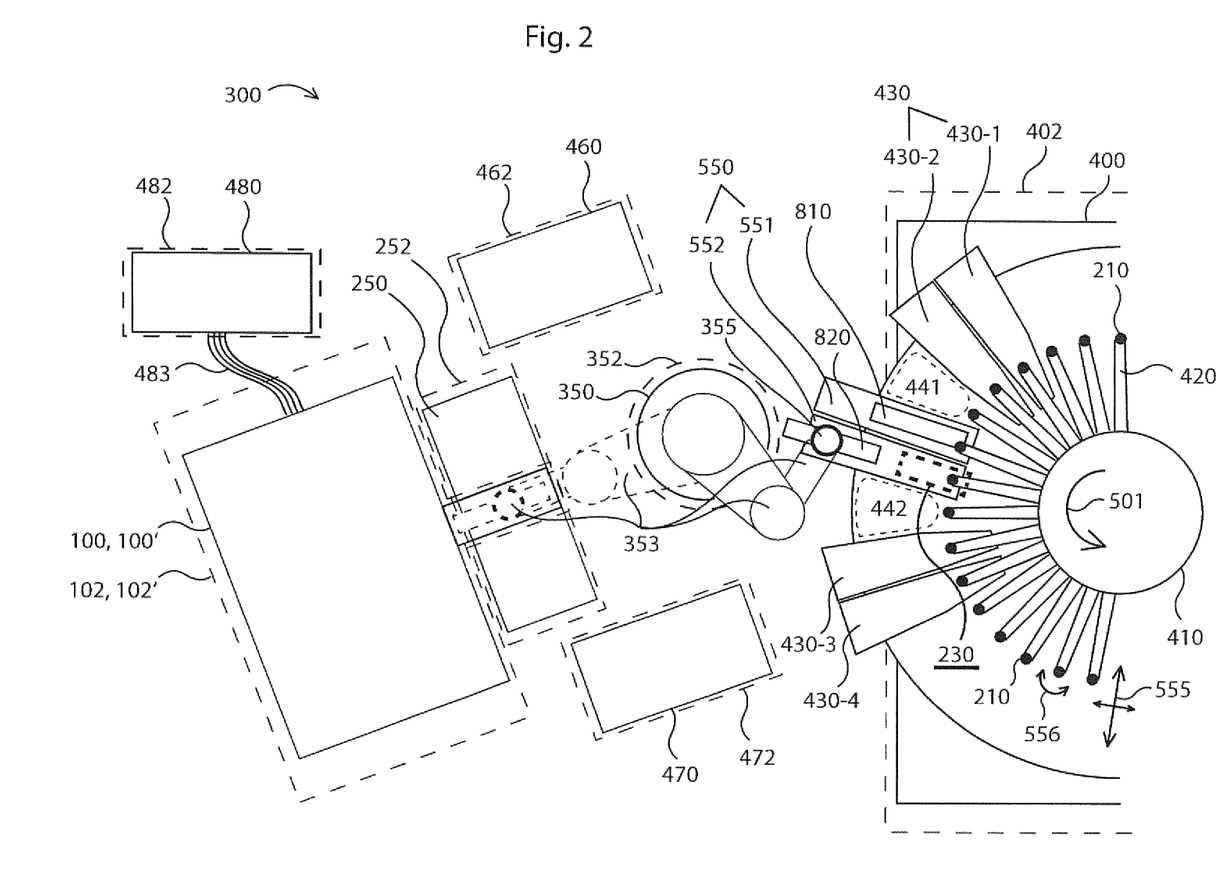
FIG. 2 is a detailed view of the automated test equipment including view of a rotary handler

FIG. 2 is a more detailed view of the automated test equipment 300 as already described with FIG. 1 only adding some features which are described here with FIG. 2 primarily. The automated test equipment 300 may additionally comprise a soak station 460 for tempering the carriers 810, 820 in a respective soak chamber of the soak station 460. The soak station 460 may have an own individual soak station footprint 462 different from any other footprint of modules in the automated test equipment 300 so that the soak station 460 is an individual separate module being exchangeable depending on purposes of tempering the carriers 810, 820 or the respective electronic components on the carriers 810, 820. Same holds for a desoak station 470 being similarly a separate and exchangeable module having an individual desoak station footprint 472. The desoak station 472 may be arranged subsequent in a process path of the carriers 810, 820 compared to the soak station 460. Within the carrier station unit 550 there may be a first carrier station 551 for receiving a first carrier 810. A second carrier station 552 and adjacent to the first carrier station 551 may also be a part of the carrier station unit 550 and may be adapted to receive the second carrier 820.

Extending radially from the rotary table 410, the handler 400 may comprise a plurality of pickup heads 420 wherein a rotatable picker 210 is arranged at the distal end of each pickup head 420. The rotatable picker 210 may allow for a definite placement of the electronic components on the carriers 810, 820. A relative movement 555 of the first carrier station 551 and the second carrier station 552 relative to the rotatable picker 210 may allow for placing an electronic component on any available location of the carriers 810, 820, so that the carriers 810, 820 may be filled completely, if appropriate. By a rotation 556 of the rotatable picker and the relative movement 555 in xy-direction in a main plane of the carrier station unit 550 the electronic components may be placed on and picked up from the carriers 810, 820 in any direction and from any location. However, the first carrier station 551 and the second carrier station 552 may require a larger area compared to any other processing station 430, or 430-1 to 430-4, so that an area, usually being equipped with a processing station 430 may be omitted on both outer sides of the adjacent arranged first carrier station 551 and second carrier station 552. Otherwise, the first carrier station 551 and the second carrier station 552 may not be operating properly. The omitted two areas may be named and being a first unused station 441 and a second unused station 442.

Figure 3:
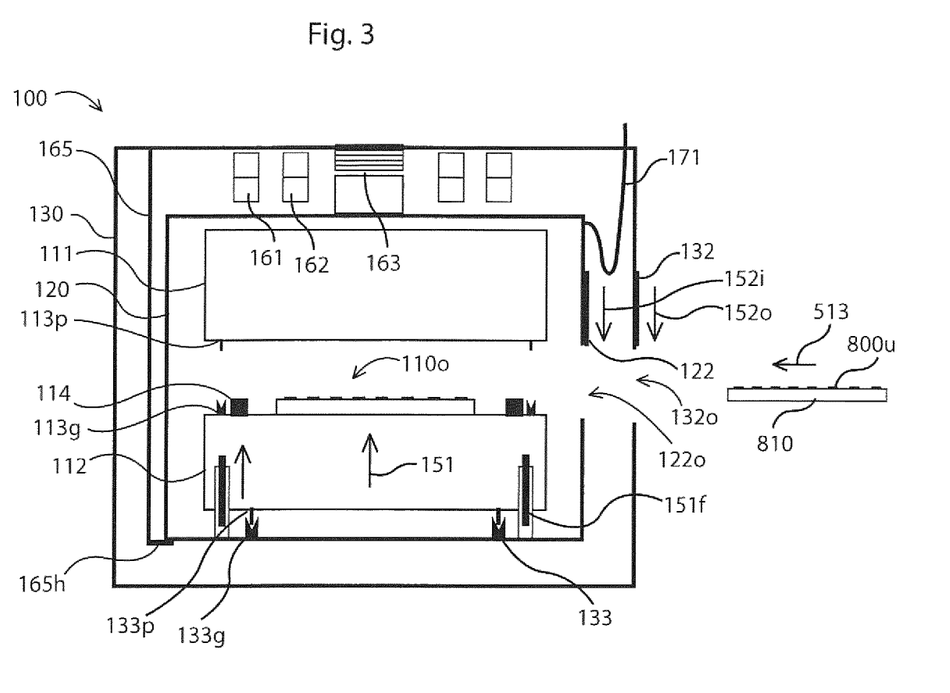
FIG. 3 shows an open microphone test module comprising an inner chamber, and including a carrier
Figure 4:
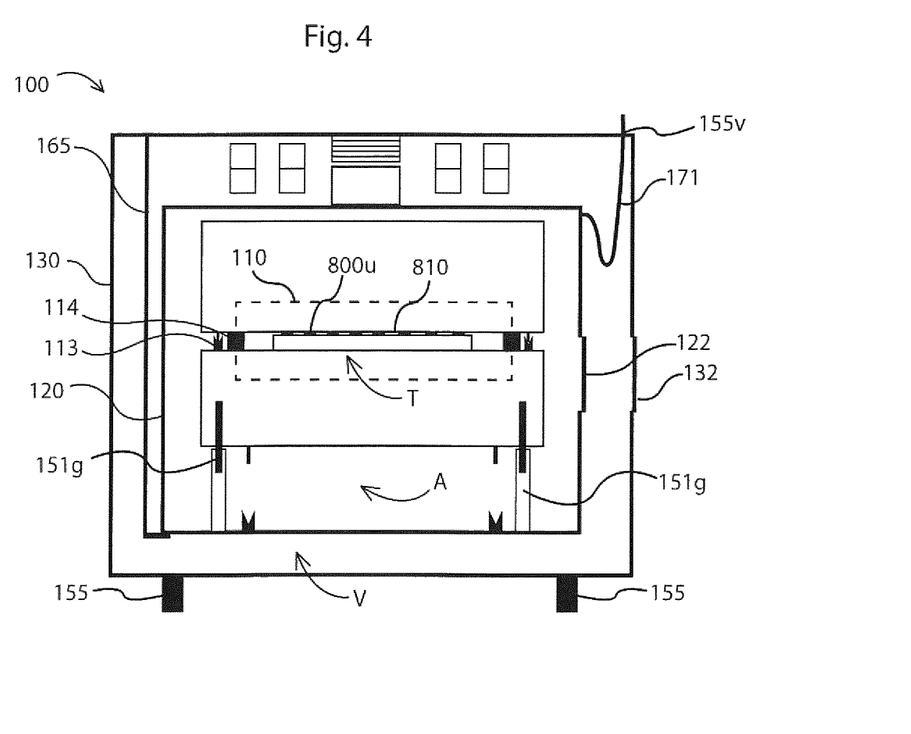
FIG. 4 shows a closed microphone test module comprising an inner chamber, and including a carrier

FIG. 3 and FIG. 4 show an embodiment of a microphone test module 100 wherein in FIG. 3 the microphone test module 100 is in an open or receiving state for receiving a carrier 810 with untested microphones 800*u* in the receptacles of the carrier 810. In FIG. 4 the microphone test module 100 is shown in a closed or testing state.

The microphone test module 100 comprises an outer chamber 130 having an outer chamber opening 132*o* through which the carrier 810 is loaded with untested microphones 800*u* may be inserted by a carrier feed 513. The outer chamber 130 may further comprise an outer chamber door 132 which may be closed for testing with an outer closing movement 152*o*. The outer chamber 130 may be airtight when the outer chamber door 132 is closed. Further, the microphone test module 100 may comprise an inner chamber 120 inside of the outer chamber 130 and containing a sound chamber 110. The sound chamber 110 may comprise a first sound chamber half 111 and a second sound chamber half 112 providing a sound chamber opening 110*o* for receiving the carrier 810. Further, the inner chamber 120 comprises an inner chamber opening 122*o* and is equipped with an inner chamber door 122 closing with an inner closing movement 152*i* for providing an airtightness during a test.

The inner chamber 120 is suspended to the inner top of the outer chamber 130 by at least one of the group of a ferromagnet 161, a diamagnet 162, an electromagnet 163, or an elastic suspension 165 in order to avoid transmission of structure-borne sound or any other mechanical vibration from the outer chamber 130 to the inner chamber 120, and by this to the sound chamber 110, respectively. However, it may be necessary to provide at least one further suspension when using the ferromagnet 161, since it may be necessary to control and adjust the overall suspension force of the ferromagnet 161 on the inner chamber 120. The elastic suspension 165 may comprise an elastic rubber cord or any material elastic material being suitable for elastically suspending the inner chamber 120 and eventually both, the first sound test chamber half 111 and the second sound test chamber half 112 being arranged inside the inner chamber 120. The first sound test chamber half 111 may be mounted to the inner top of the inner chamber 120. At least one or more suspension hooks 165*h* at the end of the suspension 165 may support the inner chamber 120 directly from the outside on the bottom of the inner chamber 120 so that structure-borne sound travels a long distance from the top of the outer chamber 130 to the outer bottom of the inner chamber 120 and may be therefore suppressed.

A positioning device 133 and a mating actuator 151*f* may both be supported from the inner bottom of the inner chamber 120. The mating actuator 151 may allow for lifting the second, lower chamber half 112 towards the first, upper chamber half 111, so that both may form the sound chamber 110 when being brought together by this mating movement 151. Further, an aligning device 113 comprising an alignment pin 113*p* mounted on the first sound chamber half 111 and comprising an alignment guide 113*g* mounted on the second sound chamber half 112, so that the sound chamber 110 is aligned when the first and second chamber halves 111, 112 are brought together and being pressed together or to each other, respectively.

In particular, the mating actuator 151*f* may rest in the closing position 151*g* and may support pressing the first, and second sound chamber halves 111, 112 together, since the inner chamber 120 is already soundproof against the outside of the outer chamber 130. A sealing ring 114 may additionally provide airtightness between the sound chamber 110 and the inner space of the inner chamber 120. The outer chamber 130 may have spring-loaded feet 155, or air-sprung feet 155 for further suppressing outside generated air-borne sound. However, the supply cable 171 may still go through the outer chamber 130 at a certain point 155*v* and may provide airtightness there, as well. The supply cable 171 may comprise a loop inside and or outside of the outer chamber 130.

A vacuum space with vacuum pressure V is now formed between the outer chamber 130 and the inner chamber 120, so that the sound chamber pressure T may be more stable, since inside the inner chamber the pressure may be close to or correspond ambient pressure A.

FIG. 5*a* to FIG. 5*i* are a schematic descriptions of a method of placing 512 untested electronic components 800*u* on a first carrier 810, and unloading 517 the tested electronic components 800*t* from the first carrier 810, while a further, second carrier 820 with previously loaded untested electronic components 800*u* is loaded to the test module 100, 100' for testing the electronic components 800*u* of the second carrier 820. The method described with FIG. 5*a* to FIG. 5*i* includes a full circle including exchanging the first carrier 810 with the second carrier 820, and vice versa.

FIG. 5*a* shows a detail of a handler 400 with two rotatable pickers 210 while referring to one rotatable picker 210*i* for initializing the process and to another rotatable picker 210*t* for unloading tested components 800*t*. The movement of the two rotatable pickers 210*i*, 210*t* in the direction of the rotation 501 may be stepwise. Therefore, the rotatable pickers 210*i*, 210*t* are in general identical but differ in the above-mentioned function and successively replace each other.

The whole process starts with a component placement 512 on the first carrier 810 from the rotatable picker 210*i* feeding untested electronic components 800*u*. As a consequence, the rotatable picker 210*t* for unloading tested components may be empty at this very beginning of the process. The first carrier 810, and the second carrier 820 may be positioned on the carrier station unit and in particular, the first carrier 810 may be positioned on the first, or left carrier station 551, while the second carrier 820 may be positioned on the second, or right carrier station 552. A relative movement 555 (in xy-direction) of the first carrier 810 relative to the untested electronic component 800u held by the rotatable picker 210i may allow for the repeatedly stepwise component placement 512 on the first carrier 810. The relative movement 555 may be achieved by either moving the first carrier station 551 relative to the rotatable picker 210i, by moving the rotatable picker 210i relative to the first carrier station 551, or by moving both. Additionally, any rotatable picker 210 may make a rotation 556. Moving the first carrier station 551 may by caused directly or indirectly by the carrier station unit 550.

When starting, the first empty carrier 810e may be successively filled with untested electronic components 800u until the first carrier is filled 810fu with untested components to a certain extend. Usually, the filled first carrier 810fu may be stepwise filled to be completely filled. However, the number of untested components may vary, e.g. depending on a test runtime, or a speed of the placement 512 of the untested electronic components 800u on the carrier 810, 820.

Subsequently, the filled first carrier 810fu may be loaded 513 to the test module 100, 100'.

FIG. 5b shows that the second carrier 820 may be brought into the position for receiving untested electronic components 800 by a left to right movement 526. The left to right movement may be equivalent to a movement from the second, right carrier station 552 to the first, left carrier station 551. A start of the first carrier testing 514i may be initialized previously, simultaneously, or subsequently so that the untested electronic components 800u on the first carrier 810 may be tested, wherein this may be abbreviated with the expression of first carrier testing 514.

The carrier station unit boundary 491 is marked with the respective dashed line and may emphasize that the carrier station unit 550 may be mounted to and be easily exchanged from the handler 400. Similarly, the module boundary 492 marked with the respective dashed line may highlight that the test module 100, 100' may be exchangeable, as well.

FIG. 5c shows the second carrier 820 being located on the first, left carrier section 551, so that the second carrier 820 starting as being empty (empty second carrier 820e) is successively filled 522 with untested electronic components 800u and as a result becomes a second carrier 820fu filled with untested components. The shown process is identical with the process from FIG. 5a with the difference that placing 522 of the untested electronic components is on the second carrier 820, and that the first carrier testing 514 may be meanwhile running. At a certain time, the second carrier 820fu may be filled to a desired extend, and the end of the first carrier testing 514f may be reached.

FIG. 5d shows an exchange of the first carrier 810 with the second carrier 820. First, with the tested electronic components 800t loaded, the first carrier 810ft may be loaded back 515 from the test module 100, 100' to the carrier station unit 550 on the second, right carrier station 552. Subsequently, the second carrier 820fu may be loaded to the test module 100, 100' being ready for testing. Since the last untested electronic component 800u has been already placed on the second carrier 820, the rotatable picker 210e is empty.

FIG. 5e and FIG. 5f show a central procedure within the complete procedure since the first carrier 810 is full with tested electronic components 800t and is a such first carrier 810 (filled with tested electronic components 800t) positioned on the first, left carrier section 551 while the second carrier 820 is loaded to the test module 100, 100' and a start of second carrier testing 524i is initiated and the second carrier testing 524 is running. This central procedure repeats with FIG. 5h and FIG. 5i with merely the first carrier 810 and the second carrier 820 being replaced by each other.

With the stepwise movement 501 the empty rotatable picker 210e (see FIG. 5d) comes into action and unloading 517 of a first tested component 800t from the respected location 817t on the first carrier 810ft towards the rotatable picker 210 fills the rotatable picker 210f. Subsequently, the stepwise movement 501 may describe a central state shown in FIG. 5f.

In FIG. 5f, the rotatable picker 210i provides a new untested electronic component 800u while the unloaded tested electronic component 800t in the rotatable picker 210t will be transferred for further processing within the handler 400. That is, the new untested electronic component 800u placement 512 (similar to FIG. 5a) on the first carrier 810 replaces the tested electronic components 800t in the location 817t to become the respective location 812u on the first carrier 810.

By successively (with intermittent stepwise movement 501) unloading 517 tested electronic components 800t from the filled locations 817t and then loading 512 untested electronic components 800u to the identical location 812u, the first carrier 810 may be exchanged with untested electronic components 800u and hence becomes a first carrier 810fu from being a first carrier 810ft as shown in FIG. 5e. It may be useful to replace the electronic components 800t with 800u since the first carrier 810 may rest in an identical position on the carrier station unit 550 and relative to the handler 400 while a new rotatable picker 210i with movement 501i provides successively untested electronic components 800u.

During this component replacement, the second carrier may be tested 524 until the test finishes 524f.

As already been mentioned FIG. 5h and FIG. 5i correspond to FIG. 5e and FIG. 5f by only a reciprocal exchange of the first carrier 810 with the second carrier 820. Reference to FIG. 5e and FIG. 5e will be made. A similar situation applies to FIG. 5g, since the described sub-procedure is equal to the sub-procedure of FIG. 5d.

FIG. 5g is equal to FIG. 5d when exchanging the first carrier 810 and the second carrier 820 with the mere difference that the rotatable picker 210t may be empty in FIG. 5d which may be irrelevant for this sub-procedure since rotatable picker 210 is already out of action and will be moved away with a subsequent step movement 501. This, in particular, also applies to FIG. 5h compared to FIG. 5e.

Therefore, for FIG. 5g, FIG. 5h, and FIG. 5i reference is made to FIG. 5d, FIG. 5e, and FIG. 5f, respectively, with the additional note that the first carrier 810 and the second carrier 820 replace each other (along with all reference signs relating to the first carrier 810 and the second carrier 820).

It should be noticed that other embodiments are possible, in particular, if two carriers 810, 820 may be loadable and unloadable simultaneously.

Figure 6:
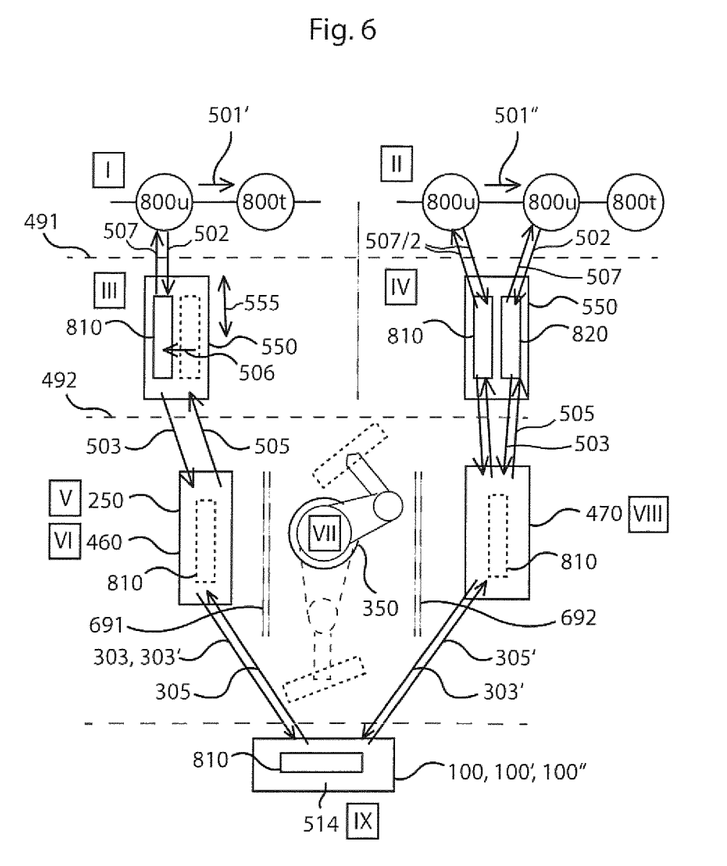
FIG. 6 is an overview of different types of embodiments of the automated test equipment

FIG. 6 shows schematically different mostly compatible variations marked with roman numerals I to IX.

I and II

Figure 5:
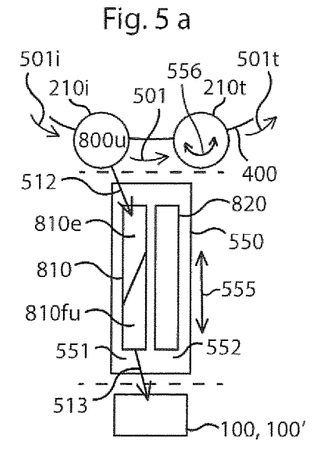
FIGS. 5*a* to 5*i* show schematically a process of loading and unloading electronic components

In particular, variation I and II may describe and replace the already introduced embodiments where a stepwise movement 501 of a rotary table 410 is shown (see FIG. 1, FIG. 2, and FIG. 5). Stepwise movements 501' and 502" are shown as straight movements but not limited to as well as stepwise movement 501 in FIG. 5 is not necessarily a circular movement.

I

The stepwise movement 501' may describe the movement of untested electronic components 800*u* and of tested electronic components 800*t* along a straight line, wherein one step is made after the other with intermittent further sub-procedures of unloading 507, and loading 502 a carrier 810. Thus, the movement 501' may resemble the stepwise movement 501 in FIG. 5(*a* to *i*).

II

The stepwise movement 501" shows a movement of the untested and tested electronic components 800*u* and 800*t* taking to steps at once. This may be useful if two carries 810 and 820 are loadable 502 and unloadable 507 simultaneously from two positions of a carrier station unit 550.

The carrier station unit boundary 491 marked with the respective dashed line emphasizes that any stepwise movement 501', 501" (, and 500) may be replaced by another stepwise movement, if appropriate. In particular, a rotary handler 400 may be replaced by another type of handler providing a straight stepwise movement (501', 501") and vice versa.

III and IV

III

In section marked with roman numeral III the sub-procedures may resemble the sub-procedures as being described with FIG. 5(*a* to *i*). The carrier 810 may undergo the movements 555 and 506 similar or identical to the movements of the first carrier 810 described with FIG. 5*a* to FIG. 5*i*.

IV

Roman numeral IV depicts a carrier station unit 550 where two carries 810 and 820 are simultaneously loadable 502 and unloadable 507 with untested electronic components 800*u* and test electronic components 800*t*, respectively. In addition to this, the two carries 810 and 820 may be themselves unloadable and loadable from the two positions of the carrier station unit 550, respectively.

The subroutine provided by IV may be useful (compared to III) if loading and unloading of the carriers as well as the further sub-procedures are quick so that the subroutine shown in IV allows for speeding up the related handler actions (of placing and unloading the untested and tested electronic components, respectively).

V, VI, and VIII

Module boundary 492 marked with the respective dashed line shows that in general any module following the carrier station unit 550 may be optionally selected and that the selected module may be easily exchangeable with a further selected module and that even two or more modules may be used when starting from a carrier station unit 550.

V shows the carrier exchange section 250 which may be used to transfer the carrier 810 from the carrier station unit 550 to the test module 100, 100' directly. Roman numeral VI shows the soak station 460 which may be in line with one or two carrier exchange section 250 in order to temper the untested electronic components 800*u* on the first carrier 810 to a specific temperature. The soak station 460 may be used in a standalone version or may comprise the exchange section 250 as an integral part, as well as being an integral part of the test module 100, 100'. In general, the movements 503, 505 of the first carrier 810 from the carrier station unit 550 and back may be a linear movement and may be a mechanically predefined movement. Also, the movement of the first carrier from the carrier exchange section 250, or from the soak station 460 towards the test module 100, 100" may be in a straight and/or predefined way. The desoak station 470 depicted with roman numeral VIII may be used and coupled within the automated test system 300 in the same way like the carrier exchange station 250 and the soak station 460 with the only difference that if a first carrier 810 will be tempered with the soak station 460 then the desoak station 470 being needed for desoaking the first carrier 810 (and the tested electronic components 800*t*) may be subsequent to the soak station 460.

VII

As an alternative and with higher flexibility the robot 350 may serve as a centred turntable allowing for any movement within its specific radius. The robot 350 may therefore replace or expand a predefined movement and may target any of the already mentioned stations and modules, such as the carrier station unit 550, the carrier exchange section 250, the soak station 460, the desoak station 470, and the test module 100, 100" directly.

IX

Various test modules 100, 100" may be used providing multiple test 514 for the untested electronic components 800*u* in the first carrier 810.

Figure 7A:
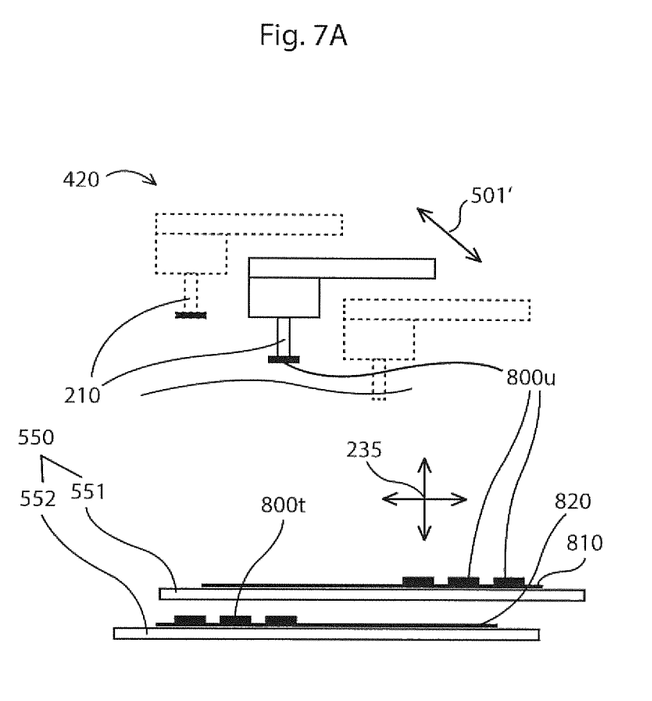
FIG. 7A shows a handler picker at a distal end of a pick-up head

FIG. 7A shows a handler picker 210 at a distal end of a pick-up head 420. With a stepwise movement 501, which may be linear, the handler picker 210 moves into a region above a carrier station unit 550 comprising a first carrier station 551 and a second carrier station 552, on each of which a carrier 810 with electronic components 800 u/t may be located. With both a vertical and horizontal movement 235 the handler picker 210 carrying one electronic component 800*u* at a time to be tested may place the electronic component 800 on a free receptacle of the carrier 810, 820, or the handler picker 210 may pick up one electronic component 800*t* at a time from the carrier 820.

Figure 7B:
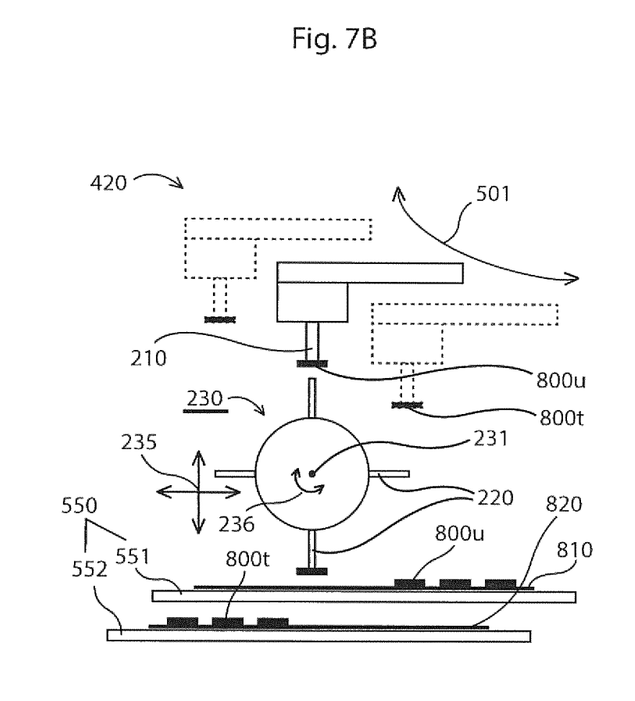
FIG. 7B shows an interaction between a handler picker and a spinner picker

FIG. 7B shows an interaction between a handler picker 210 and a spinner 230. A stepwise movement 501' of the handler picker 210 may stop above the spinner 230, so that the spinner 230 may pick-up one electronic component 800*u* at a time with one of multiple spinner pickers 220. Then, with a rotation 236 about a spinner axis 231, the spinner 230 may turn the electronic component upside down, and vice versa. With a vertical and horizontal movement 235 of the spinner 230 the electronic component 800*u* may be placed on the carrier 810. Same holds for picking-up one electronic component 800*t* a time by the spinner 230 twisting the electronic component 800*t* and handing it over to the handler picker 210. The handler picker 210 may transfer the electronic component 800*t* to the next position with a circular movement 501.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The invention claimed is:

1. An automated test system for testing singulated electronic components, the automated test system comprising:
    a handler, comprising a plurality of handler pickers and/or a plurality of spinner pickers, the plurality of handler pickers and/or the plurality of spinner pickers each being adapted to pick up one electronic component at a time;
    at least one processing station for processing the electronic components being picked up by one of the plurality of handler pickers;

a carrier station unit for loading the electronic components onto a plurality of carriers and unloading the electronic components from the plurality of carriers, each of the plurality of carriers having receptacles for carrying the electronic components, a first carrier of the plurality of carriers being located in the carrier station unit, wherein the first carrier is adapted to carry a first plurality of electronic components to be tested, and wherein:
  the plurality of handler pickers and/or the plurality of spinner pickers are each adapted to place one electronic component at a time on the first carrier, and/or
  the plurality of handler pickers and/or the plurality of spinner pickers are each adapted to pick up one electronic component at a time from the first carrier;
a second carrier of the plurality of carriers, wherein the second carrier is adapted to carry a second plurality of electronic components to be tested;
a test unit for testing the electronic components being located on a carrier of the plurality of carriers while each electronic component rests in a receptacle of the carrier, wherein the second carrier is located in the test unit, and wherein:
  while the second plurality of electronic components on the second carrier are tested in the test unit and the second plurality of electronic components rest on the second carrier,
  simultaneously the first carrier is 1) loaded with the first plurality of electronic components by the plurality of handler pickers and/or the plurality of spinner pickers and/or 2) unloaded from the first plurality of electronic components by the plurality of handler pickers and/or the plurality of spinner pickers; and
at least one selected from the group consisting of a tester, a soak station, a de-soak station, and a further test unit;
wherein at least two selected from the group consisting of the handler, the test unit, the tester, the soak station, the de-soak station, and the further test unit are standalone units each having a different footprint and are movable to or away from each other.

2. The automated test system according to claim 1, wherein,
when the second plurality of electronic components on the second carrier are tested in the test unit, simultaneously the first plurality of electronic components are loaded on or unloaded from the first carrier by the plurality of handler pickers and/or the plurality of spinner pickers; and
simultaneously the at least one processing station processes one electronic component transported by one of the plurality of handler pickers.

3. The automated test system according to claim 1, wherein the plurality of handler pickers and/or the plurality of spinner pickers are each adapted to place and/or pick up one electronic component at a time from the first carrier by:
  a movement of the carrier comprising a linear movement in up to 3 dimensions, and/or
  a movement of the one handler picker and/or spinner picker comprising a linear movement in up to 3 dimensions and/or a rotatable movement of the handler picker and/or of the spinner picker.

4. The automated test system according to claim 1, wherein the carrier station unit comprises a first carrier station and a second carrier station, each of the first and second carrier stations being adapted to receive, carry, and/or move at least one of the first and second carrier, and being adapted to replace the first carrier by the second carrier.

5. The automated test system according to claim 1, further comprising:
  at least one further carrier, adapted to being loaded with and unloaded from a further plurality of electronic components by a handler picker and/or a spinner picker,
  wherein the further carrier is adapted in that the further plurality of electronic components are tested while resting in receptacles of the further carrier.

6. The automated test system according to claim 1, further comprising:
  at least two processing stations,
  wherein at least one of the at least two processing stations is located upwards of the carrier station unit, and wherein at least one other of the at least two processing stations is located downwards the carrier station unit.

7. The automated test system according to claim 1,
wherein the handler comprises a spinner, being linearly movable and rotatable about a spinner axis, and
wherein the plurality of spinner pickers are arranged to be pointing radially outwards from the spinner axis.

8. The automated test system according to claim 1,
wherein the handler comprises a rotary table, and
wherein the plurality of handler pickers are arranged at distal ends of pickup heads radially extending from a center of the rotary table.

9. The automated test system according to claim 1, further comprising:
  a robot and/or a carrier exchange section, the robot and/or the carrier exchange section being adapted to receive the first carrier with the first plurality of electronic components and transferring the first carrier to the test unit, in that after having transferred the first carrier the robot and/or the carrier exchange section completely remove from the test unit.

10. The automated test system according to claim 1, wherein the test unit is a microphone test unit adapted to test microphones.

11. A method of testing singulated electronic components comprises:
  providing an automated test system, comprising:
    a handler, comprising a plurality of handler pickers and/or a plurality of spinner pickers, the plurality of handler pickers and/or the plurality of spinner pickers each being adapted to pick up one electronic component at a time,
    at least one processing station for processing the electronic components being picked up by one of the plurality of handler pickers, and
    a carrier station unit for loading the electronic components onto a plurality of carriers and unloading the electronic components from the plurality of carriers, each of the plurality of carriers having receptacles for carrying the electronic components, a first carrier of the plurality of carriers being located in the carrier station unit,
      wherein the first carrier is adapted to carry a first plurality of electronic components to be tested,
      wherein the plurality of handler pickers and/or the plurality of spinner pickers are each adapted to place one electronic component at a time on the first carrier, wherein the plurality of handler pickers and/or the plurality of spinner pickers are each adapted to pick up one electronic component at a time,
a second carrier of the plurality of carriers, wherein the second carrier is adapted to carry a second plurality of electronic components to be tested, and
a test unit for testing the electronic components located on a carrier of the plurality of carriers while each electronic component rest in a receptacle of the carrier, wherein the second carrier is located in the test unit;
testing the second plurality of electronic components of the second carrier in the test unit while the second plurality electronic components rest on the second carrier; and
simultaneously loading the first plurality of electronic components on the first carrier with the plurality of handler pickers and/or the plurality of spinner pickers and/or unloading the first plurality of electronic components from the first carrier with the plurality of handler pickers and/or the plurality of spinner pickers; and
providing at least one selected from a group consisting of a tester, a soak station, a de-soak station, and a further test unit;
wherein at least two selected from the group of the handler, the test unit, the tester, the soak station, the de-soak station, and the further test unit are stand-alone units each having a different footprint are movable to or away from each other.

12. The method of testing singulated electronic components according to claim 11, wherein,
when the second plurality of electronic components on the second carrier are tested in the test unit, simultaneously the first plurality of electronic components are loaded on and/or the plurality of unloaded from the first carrier with the plurality of handler pickers and/or spinner pickers;
the at least one processing station simultaneously processes one electronic component picked up by one of the plurality of handler pickers.

13. The method of testing singulated electronic components according to claim 11, wherein the plurality of handler pickers and/or the plurality of spinner pickers are each adapted to place and/or pick up one electronic component at a time from the first carrier by:
moving the handler picker or the spinner picker and the carrier relative to each other.

14. The method of testing singulated electronic components according to claim 11, wherein the plurality of handler pickers and/or the plurality of spinner pickers are each adapted to pick up one electronic component at a time by:
moving the carrier comprising a linear movement in up to 3 dimensions; and/or
moving the handler picker or spinner picker, wherein the movement comprises a linear movement in up to 3 dimensions and/or a rotatable movement of the handler picker or spinner picker.

* * * * *